United States Patent

Lee et al.

(10) Patent No.: US 9,793,347 B2
(45) Date of Patent: Oct. 17, 2017

(54) SEMICONDUCTOR DEVICE AND METHOD OF FABRICATING THE SAME

(71) Applicant: SAMSUNG ELECTRONICS CO., LTD., Suwon-si, Gyeongg-do (KR)

(72) Inventors: Woo-Jin Lee, Hwaseong-si (KR); Sang-Hoon Ahn, Goyang-si (KR); Gil-Heyun Choi, Seoul (KR); Jong-Won Hong, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/931,427

(22) Filed: Nov. 3, 2015

(65) Prior Publication Data

US 2016/0056235 A1 Feb. 25, 2016

Related U.S. Application Data

(62) Division of application No. 14/165,817, filed on Jan. 28, 2014, now Pat. No. 9,214,381.

(30) Foreign Application Priority Data

Mar. 12, 2013 (KR) ........................ 10-2013-0026388

(51) Int. Cl.
H01L 29/06 (2006.01)
H01L 27/02 (2006.01)
H01L 21/768 (2006.01)
H01L 21/764 (2006.01)

(52) U.S. Cl.
CPC ........ *H01L 29/0649* (2013.01); *H01L 21/764* (2013.01); *H01L 21/7682* (2013.01); *H01L 21/76805* (2013.01); *H01L 21/76831* (2013.01)

(58) Field of Classification Search
CPC .................................................. H01L 29/0649
USPC ........................................................ 257/522
See application file for complete search history.

(56) References Cited

U.S. PATENT DOCUMENTS

| 6,376,330 | B1 | 4/2002 | Fulford, Jr. et al. |
| 6,563,219 | B2 | 5/2003 | Ireland et al. |
| 7,045,849 | B2 | 5/2006 | Chen et al. |
| 7,087,998 | B2 | 8/2006 | Lee et al. |
| 7,573,092 | B2 | 8/2009 | Matsui et al. |
| 7,754,601 | B2 | 7/2010 | Chen et al. |

(Continued)

FOREIGN PATENT DOCUMENTS

| JP | 2007073811 | 3/2007 |
| JP | 2008010534 | 1/2008 |

(Continued)

*Primary Examiner* — Moazzam Hossain
(74) *Attorney, Agent, or Firm* — F. Chau & Associates, LLC

(57) ABSTRACT

A semiconductor device includes a substrate, a conductive pattern, a side spacer, and an air gap. The substrate includes an interlayer insulating layer and a trench penetrating the interlayer insulating layer. The conductive pattern is disposed within the trench of the substrate. The side spacer is disposed within the trench. The side spacer covers an upper side surface of the conductive pattern. The air gap is disposed within the trench. The air gap is bounded by a sidewall of the trench, the side spacer, and a lower side surface of the conductive pattern. A level of a bottom surface of the conductive pattern is lower than a level of bottom surfaces of the side spacer.

8 Claims, 17 Drawing Sheets

(56) References Cited

U.S. PATENT DOCUMENTS

| | | |
|---|---|---|
| 7,838,373 B2 | 11/2010 | Giles et al. |
| 7,884,415 B2 | 2/2011 | Nagano |
| 7,994,046 B2 | 8/2011 | Jeng |
| 2004/0026746 A1* | 2/2004 | Nakazawa ........ H01L 21/76264 257/374 |
| 2007/0066047 A1* | 3/2007 | Ye ..................... H01L 21/31144 438/620 |
| 2008/0174017 A1* | 7/2008 | Yang .................. H01L 21/7682 257/751 |
| 2010/0001409 A1 | 1/2010 | Humbert et al. |
| 2010/0093168 A1* | 4/2010 | Naik ................. H01L 21/31144 438/618 |
| 2010/0200994 A1 | 8/2010 | Kim |
| 2011/0183516 A1 | 7/2011 | Lee |
| 2011/0217838 A1 | 9/2011 | Hsieh et al. |
| 2012/0168899 A1* | 7/2012 | Kim .................... H01L 21/7682 257/522 |
| 2012/0276711 A1* | 11/2012 | Yoon .................... H01L 21/764 438/421 |
| 2012/0292782 A1* | 11/2012 | Lee ....................... H01L 23/481 257/774 |
| 2014/0027916 A1* | 1/2014 | Lee ....................... H01L 21/764 257/773 |

FOREIGN PATENT DOCUMENTS

| | | |
|---|---|---|
| JP | 2010177560 | 8/2010 |
| KR | 1020010004008 | 1/2001 |
| KR | 1020010011638 | 2/2001 |
| KR | 1020030087351 | 11/2003 |
| KR | 1020050068861 | 7/2005 |
| KR | 1020080012056 | 2/2008 |

* cited by examiner

SEMICONDUCTOR DEVICE AND METHOD OF FABRICATING THE SAME

CROSS-REFERENCE TO RELATED APPLICATION

This application is a divisional of U.S. application Ser. No. 14/165,817 filed on Jan. 28, 2014, which claims priority under 35 U.S.C. §119 to Korean Patent Application No. 10-2013-0026388, filed on Mar. 12, 2013 in the Korean Intellectual Property Office, the disclosure of which is hereby incorporated by reference in its entirety.

TECHNICAL FIELD

The present inventive concept relates to a semiconductor device and a method of fabricating the same.

DISCUSSION OF RELATED ART

Conductive patterns serve to connect various elements incorporated in semiconductor devices. Capacitance between the conductive patterns may delay a signal propagation. As semiconductor devices are highly integrated, such signal delay decreases the performance thereof.

SUMMARY

According to an exemplary embodiment of the inventive concept, a semiconductor device includes a semiconductor substrate, a lower conductive pattern, an interlayer insulating layer, an upper conductive pattern, a side spacer, and an air gap. The lower conductive pattern is disposed on the semiconductor substrate. The interlayer insulating layer is disposed on the semiconductor substrate. The interlayer insulating layer includes an upper penetrating hole partially exposing a top surface of the lower conductive pattern. The upper conductive pattern is disposed within the upper penetrating hole and is disposed on the top surface of the lower conductive pattern. The upper conductive pattern is electrically connected to the lower conductive pattern. The side spacer is disposed within the upper penetrating hole. The side spacer covers an upper side surface of the upper conductive pattern. The air gap is disposed within the upper penetrating hole. The air gap is bounded by a sidewall of the upper penetrating hole, the side spacer, part of the top surface of the lower conductive pattern, and a lower side surface of the upper conductive pattern.

According to an exemplary embodiment of the inventive concept, a semiconductor device includes a substrate, a conductive pattern, a side spacer, and an air gap. The substrate includes an interlayer insulating layer and a trench penetrating the interlayer insulating layer. The conductive pattern is disposed within the trench of the substrate. The side spacer is disposed within the trench. The side spacer covers an upper side surface of the conductive pattern. The air gap is disposed within the trench. The air gap is bounded by a sidewall of the trench, the side spacer, and a lower side surface of the conductive pattern. A level of a bottom surface of the conductive pattern is lower than a level of bottom surfaces of the side spacer.

According to an exemplary embodiment of the inventive concept, a semiconductor device includes a semiconductor substrate, an interlayer insulating layer, a conductive pattern, an etch stop layer, a side spacer, and an air gap. The interlayer insulating layer is disposed on the semiconductor substrate. The interlayer insulating layer includes a trench penetrating the interlayer insulating layer. The conductive pattern is disposed within the trench. A bottom surface of the conductive pattern being contact with a bottom surface of the trench. The etch stop layer is disposed on the conductive pattern. The etch stop layer covers the trench. The side spacer covers a side surface of the conductive pattern. The side spacer is spaced from the interlayer insulating layer. The air gap is bounded by the interlayer insulating layer, the conductive pattern, the etch stop layer and the side spacer. A bottom surface of the side spacer is spaced from the bottom surface of the trench.

BRIEF DESCRIPTION OF THE DRAWINGS

These and other features of the inventive concept will become more apparent by describing in detail exemplary an exemplary embodiment thereof with reference to the accompanying drawings of which.

DETAILED DESCRIPTION OF THE EXEMPLARY EMBODIMENTS

Figure 1:
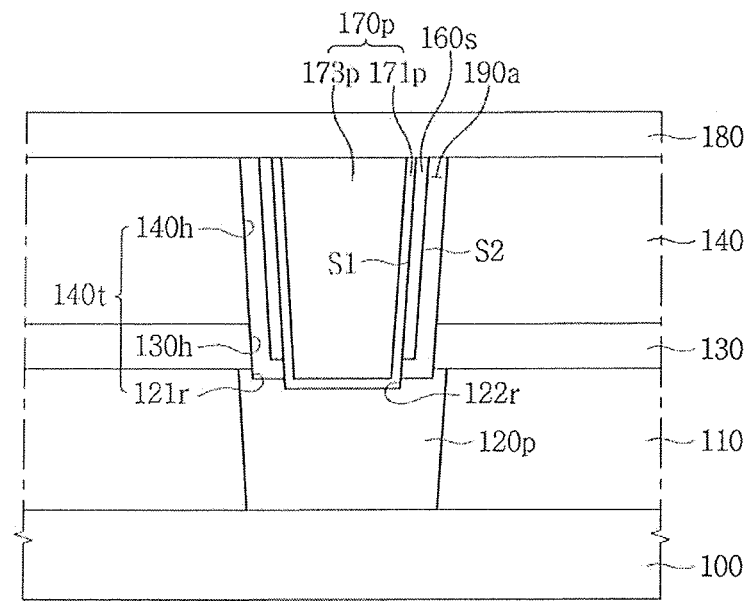
FIG. 1 is a cross-sectional view of a semiconductor device according to an exemplary embodiment of the inventive concept.

Exemplary an exemplary embodiment of the inventive concept will be described below in detail with reference to the accompanying drawings. However, the inventive concept may be embodied in different forms and should not be construed as limited to the exemplary embodiment set forth herein. In the drawings, the thickness of layers and regions may be exaggerated for clarity. It will also be understood that when a layer is referred to as being "on" another layer or substrate, it may be directly on the other layer or substrate, or intervening layers may also be present. Like reference numerals may refer to the like elements throughout the specification and drawings.

FIG. 1 is a cross-sectional view of a semiconductor device 100a according to an exemplary embodiment of the inventive concept.

Referring to FIG. 1, a semiconductor device 100a includes a semiconductor substrate 100, a lower interlayer insulating layer 110, a lower conductive pattern 120p, a lower etch stop layer 130, an upper interlayer insulating layer 140, side spacers 160s, an upper conductive pattern 170p, an upper etch stop layer 180, and an air gap 190a.

The semiconductor substrate 100 may include a silicon wafer or a silicon-on-insulator (SOI) substrate. The lower interlayer insulating layer 110 is disposed on the semiconductor substrate 100. Various elements may be disposed between the semiconductor substrate 100 and the lower interlayer insulating layer 110. The lower interlayer insulating layer 110 may cover the various elements disposed on the semiconductor substrate 100. The lower interlayer insulating layer 110 may include tetraethyl orthosilicate (TEOS).

The lower conductive pattern 120p is disposed in the lower interlayer insulating layer 110. The lower conductive pattern 120p may be electrically connected to at least one of various elements disposed between the semiconductor substrate 100 and the lower interlayer insulating layer 110. The lower conductive pattern 120p penetrates the lower interlayer insulating layer 110. A level of a top surface of the lower conductive pattern 120p is substantially the same as a level of a top surface of the lower interlayer insulating layer 110. The lower interlayer insulating layer 110 surrounds a side surface of the lower conductive pattern 120p.

The lower conductive pattern 120p may include a conductive material. For example, the lower conductive pattern 120p may include tungsten (W).

The lower conductive pattern 120p includes a first recess region 121r and a second recess region 122r.

The first recess region 121r is disposed in the top surface of the lower conductive pattern 120p. A maximum horizontal width of the first recess region 121r is less than a horizontal width of the top surface of the lower conductive pattern 120p. A level of a bottom surface of the first recess region 121r is lower than a level of the top surface of the lower conductive pattern 120p. A level of the bottom surface of the first recess region 121r is lower than a level of the top surface of the lower interlayer insulating layer 110.

The second recess region 122r is disposed in the top surface of the lower conductive pattern 120p. The second recess region 122r is disposed in the first recess region 121r. A maximum horizontal width of the second recess region 122r is less than the maximum horizontal width of the first recess region 121r. A horizontal width of the second recess region 122r in the bottom surface of the first recess region 121r is less than a horizontal width of the bottom surface of the first recess region 121r. A level of a bottom surface of the second recess region 122r is lower than a level of the bottom surface of the first recess region 121r. A sidewall of the second recess region 122r need not be parallel to a sidewall of the first recess region 121r.

The lower etch stop layer 130 is disposed on the lower interlayer insulating layer 110. The lower etch stop layer 130 is in contact with the top surface of the lower interlayer insulating layer 110.

The lower etch stop layer 130 may have a different etch rate from the lower interlayer insulating layer 110. The lower etch stop layer 130 may have etch selectivity with respect to the lower interlayer insulating layer 110. The lower etch stop layer 130 may be harder than the lower interlayer insulating layer 110. For instance, the lower etch stop layer 130 may include silicon nitride (SiN) or silicon carbon nitride (SiCN).

The lower etch stop layer 130 includes a lower penetrating hole 130h. The lower penetrating hole 130h penetrates the lower etch stop layer 130. The lower penetrating hole 130h partially exposes the top surface of the lower conductive pattern 120p. The lower penetrating hole 130h exposes the first recess region 121r of the lower conductive pattern 120p.

A sidewall of the lower penetrating hole 130h corresponds to an extension line of the sidewall of the first recess region 121r. A horizontal width of the lower penetrating hole 130h measured at a bottom surface of the lower etch stop layer 130 is substantially equal to a horizontal width of the first recess region 121r measured at the top surface of the lower conductive pattern 120p. A horizontal width of the lower penetrating hole 130h measured at the top surface of the lower interlayer insulating layer 110 is substantially equal to a horizontal width of the first recess region 121r measured at the top surface of the lower interlayer insulating layer 110.

The upper interlayer insulating layer 140 is disposed on the lower etch stop layer 130. The lower etch stop layer 130 is interposed between the lower interlayer insulating layer 110 and the upper interlayer insulating layer 140. The lower etch stop layer 130 is interposed between the lower conductive pattern 120p and the upper interlayer insulating layer 140. The upper interlayer insulating layer 140 is in contact with the top surface of the lower etch stop layer 130.

The upper interlayer insulating layer 140 may have a different etch rate from the lower etch stop layer 130. The upper interlayer insulating layer 140 may have etch selectivity with respect to the lower etch stop layer 130. The upper interlayer insulating layer 140 may include a material having a low dielectric constant. For instance, the upper interlayer insulating layer 140 may include a low-k dielectric layer.

The upper interlayer insulating layer 140 includes an upper penetrating hole 140h. The upper penetrating hole 140h penetrates the upper interlayer insulating layer 140. The upper penetrating hole 140h exposes the lower penetrating hole 130h. The upper penetrating hole 140h exposes the first recess region 121r of the lower conductive pattern 120p.

A trench 140t includes the first recess region 121r, the lower penetrating hole 130h, and the upper penetrating hole 140h. A sidewall of the trench 140t includes the sidewall of the lower penetrating hole 130h, a sidewall of the upper penetrating hole 140h, and the sidewall of the first recess region 121r. A level of a bottom surface of the trench 140t is substantially the same as a level of a bottom surface of the first recess region 121r. The trench 140t partially exposes the top surface of the lower conductive pattern 120p. The trench 140t penetrates the upper interlayer insulating layer 140.

The side spacers 160s are disposed within the trench 140t. A level of top surfaces of the side spacers 160s is substantially the same as a level of a top surface of the upper interlayer insulating layer 140. The side spacers 160s are disposed on the top surface of the lower conductive pattern 120p. The side spacers 160s are disposed on the bottom surface of the first recess region 121r. The side spacers 160s need not vertically overlap the bottom surface of the second recess region 122r.

The side spacers 160s are spaced apart from the sidewall of the trench 140t. The side spacers 160s are spaced apart from the sidewall of the lower penetrating hole 130h, the sidewall of the upper penetrating hole 140h, and the sidewall of the first recess region 121r. The side spacers 160s are spaced apart from the bottom surface of the trench 140t. The side spacers 160s are spaced apart from the bottom surface of the first recess region 121r. A level of bottom surfaces of the side spacers 160s is higher than a level of the bottom surface of the first recess region 121r. A level of the bottom surfaces of the side spacers 160s is higher than a level of the top surface of the lower conductive pattern 120p.

The side spacers 160s are disposed on a sidewall of the upper conductive pattern 170p. The side spacers 160s are in contact with the side surface of the upper conductive pattern 170p. Each of the side spacers 160s includes a first side surface S1 and a second side surface S2.

The first side surface S1 of each of the side spacers 160s is in contact with the side surface of the upper conductive pattern 170p. The first side surface S1 of each of the side spacers 160s corresponds to an extension line of the sidewall of the second recess region 122r.

The second side surface S2 of the side spacers 160s is opposite to the first side surface S1 of the side spacers 160s. The second side surface S2 of the side spacers 160s faces the sidewall of the trench 140. The second side surface S2 of each of the side spacers 160s faces the sidewall of the lower penetrating hole 130h and the sidewall of the upper penetrating hole 140h.

The second side surface S2 of each of the side spacers 160s may be parallel to the facing sidewall of the trench 140t. The second side surface S2 of each spacer 160s partially overlaps the lower penetrating hole 130h and is parallel to the sidewall of the lower penetrating hole 130h. The second side surface S2 partially overlaps the upper penetrating hole 140h and is parallel to the sidewall of the upper penetrating hole 140h. A horizontal distance between the second side surface S2 and the sidewall of the lower penetrating hole 130h is substantially equal to a horizontal distance between the second side surface S2 and the sidewall of the upper penetrating hole 140h.

The bottom surfaces of the side spacers 160s are parallel to the bottom surface of the first recess region 121r. A vertical distance between the bottom surface of each of the side spacers 160s and the bottom surface of the first recess region 121r may be equal to the horizontal distance between the second side surface S2 of each of the side spacers 160s and the sidewall of the first recess region 121r. The vertical distance between the bottom surface of each side spacer 160s and the bottom surface of the first recess region 121r may be substantially equal to the horizontal distance between the second side surface S2 of each of the side spacers 160s and the sidewall of the lower penetrating hole 130h. The vertical distance between the bottom surface of each of the side spacers 160s and the bottom surface of the first recess region 121r may be equal to the horizontal distance between the second side surface S2 of each of the side spacers 160s and the sidewall of the upper penetrating hole 140h.

The side spacers 160s may have a different etch rate from the upper interlayer insulating layer 140. The side spacers 160s may have an etch selectivity with respect to the upper interlayer insulating layer 140. The side spacers 160s may include the substantially same material as the lower etch stop layer 130. For example, the side spacers 160s may include SiCN.

The upper conductive pattern 170p is electrically connected to the lower conductive pattern 120p. The upper conductive pattern 170p is disposed within the trench 140t. A level of a top surface of the upper conductive pattern 170p is substantially the same as a level of the top surface of the upper interlayer insulating layer 140. A level of the top surface of the upper conductive pattern 170p is substantially the same as a level of the top surfaces of the side spacers 160s. The upper conductive pattern 170p is interposed between the side spacers 160s.

A level of a bottom surface of the upper conductive pattern 170p is lower than a level of the bottom surfaces of the side spacers 160s. The upper conductive pattern 170p is extended into the first recess region 121r of the lower conductive pattern 120p. The upper conductive pattern 170p is further extended into the second recess region 122r of the lower conductive pattern 120p. A level of the bottom surface of the upper conductive pattern 170p is lower than a level of the bottom surface of the trench 140t. A level of the bottom surface of the upper conductive pattern 170p is lower than a level of the bottom surface of the first recess region 121r. The upper conductive pattern 170p is in contact with the lower conductive pattern 120p. A level of the bottom surface of the upper conductive pattern 170p is substantially the same as a level of the bottom surface of the second recess region 122r.

The upper conductive pattern 170p completely fills the second recess region 122r. A horizontal width of the bottom surface of the upper conductive pattern 170p is substantially equal to a horizontal width of the bottom surface of the second recess region 122r.

The upper conductive pattern 170p includes a barrier pattern 171p and a metal pattern 173p.

The barrier pattern 171p covers side and bottom surfaces of the metal pattern 173p. The barrier pattern 171p is in contact with the side spacers 160s. The barrier pattern 171p is in contact with the second recess region 122r. The barrier pattern 171p is in contact with the sidewall and bottom surface of the second recess region 122r. The barrier pattern 171p may include tantalum (Ta) or tantalum nitride (TaN). The barrier pattern 171p may include a stack structure of a Ta pattern and a TaN pattern.

The metal pattern 173p is disposed in the barrier pattern 171p. The side and bottom surfaces of the metal pattern 173p are surrounded by the barrier pattern 171. The metal pattern 173p may include a metal material. For example, the metal pattern 173 may include copper (Cu).

The upper etch stop layer 180 is disposed on the upper interlayer insulating layer. The upper etch stop layer 180 is disposed on the side spacers 160s. The upper etch stop layer 180 is disposed on the upper conductive pattern 170p. The upper etch stop layer 180 is in contact with the upper interlayer insulating layer 140, the side spacers 160s, and the upper conductive pattern 170p. A level of a bottom surface of the upper etch stop layer 180 is substantially the same as a level of the top surface of the upper interlayer insulating layer 140. A level of the upper etch stop layer 180 is substantially the same as a level of the top surfaces of the side spacers 160s. A level of the upper etch stop layer 180 is substantially the same as a level of the top surface of the upper conductive pattern 170p.

The upper etch stop layer 180 may have a different etch rate from the upper interlayer insulating layer 140. The upper etch stop layer 180 may have etch selectivity with respect to the upper interlayer insulating layer 140. The upper etch stop layer 180 may include substantially the same material as the side spacers 160s. For example, the upper etch stop layer 180 may include SiCN. The upper etch stop layer 180 may be harder than the side spacers 160s.

The air gap 190a is disposed within the trench 140t. The air gap 190a is interposed between the trench 140t and the side spacers 160s. The air gap 190a is interposed between the sidewall of the trench 140t and the second side surface S2 of each side spacer 160s, and between the bottom surface of the trench 140t and the bottom surface of each side spacer

160s. The air gap 190a is extended along the sidewall and bottom surface of the trench 140t. The air gap 190a is interposed between the sidewall of the upper penetrating hole 140h and the second side surface S2 of each side spacer 160s. The air gap 190a is interposed between the sidewall of the lower penetrating hole 130h and the second side surface S2. The air gap 190a is interposed between the bottom surface of the first recess region 121r and the bottom surface of each side spacer 160s. The air gap 190a is extended along the sidewall of the upper penetrating hole 140h, the sidewall of the lower penetrating hole 130h, and the top surface of the lower conductive pattern 120p.

The air gap 190a is defined by the lower conductive pattern 120p, the lower etch stop layer 130, the upper interlayer insulating layer 140, the side spacer 160s, the upper conductive pattern 170p, and the upper etch stop layer 180. A lowest level of the air gap 190a is substantially the same as a level of the bottom surface of the first recess region 121r of the lower conductive pattern 120p. The lowest level of the air gap 190a is substantially the same as a level of the bottom surface of the trench 140t. A highest level of the air gap 190a is substantially the same as a level of the bottom surface of the upper etch stop layer 180. The highest level of the air gap 190a is substantially the same as a level of the top surface of the upper interlayer insulating layer 140. The highest level of the air gap 190a is substantially the same as a level of the top surface of each of the side spacers 160s. The highest level of each of the air gaps 190a is substantially the same as a level of the top surface of the upper conductive pattern 170p.

The air gap 190a is extended along the top surface of the lower conductive pattern 120p to the side surface of the upper conductive pattern 170p. The air gap 190a exposes part of the side surface of the upper conductive pattern 170p. The exposed part of the upper conductive pattern 170p is disposed between the top surface of the lower conductive pattern 120p and the bottom surface of each of the side spacers 160s. The side surface of the upper conductive pattern 170p may be partially exposed by the air gap 190a.

The side surface of the upper conductive pattern 170p partially exposed by the air gap 190a corresponds to the extension line of the side surface of the second recess region 122r. The side surface of the upper conductive pattern 170p partially exposed by the air gap 190a corresponds to an extended boundary line between the upper conductive pattern 170p and each side spacer 160s. The side surface of the upper conductive pattern 170p partially exposed by the air gap 190a may correspond to an extension line of the first side surface S1 of each side spacer 160s. The sidewall of the second recess region 122r corresponds to the extension line of the first side surface S1 of each of the side spacers 160s.

In the semiconductor device according to an exemplary embodiment of the inventive concept, the air gap 190a is interposed between the side spacers 160s of the upper conductive pattern 170p and the trench 140t. For example, the side surface of the upper conductive pattern 170p is surrounded by the air gap 190a. Thus, capacitance between the upper conductive pattern 170p and other adjacent conductive patterns may be reduced, thereby decreasing a signal delay time of the upper conductive pattern 170p.

Figure 2:
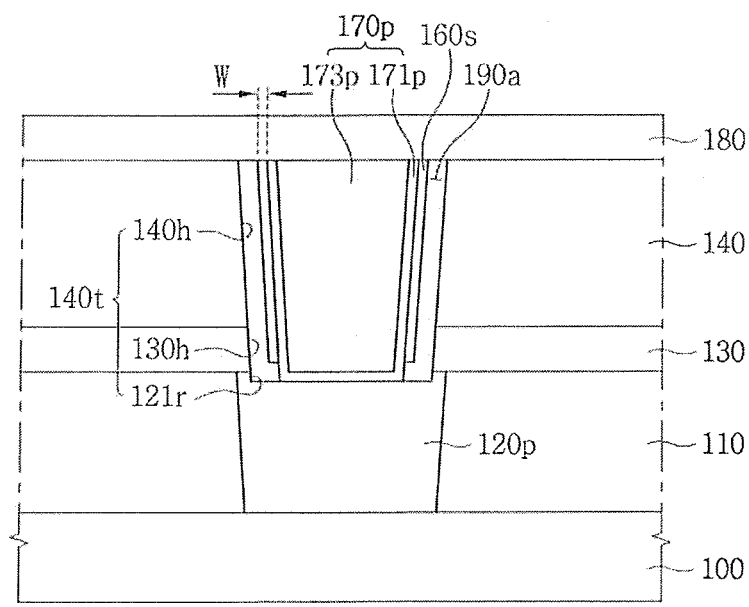
FIG. 2 is a cross-sectional view of a semiconductor device according to an exemplary embodiment of the inventive concept.

FIG. 2 is a cross-sectional view of a semiconductor device according to an exemplary embodiment of the inventive concept.

Referring to FIG. 2, a semiconductor device according to the embodiments of the inventive concept includes a semiconductor substrate 100, a lower interlayer insulating layer 110, a lower conductive pattern 120p, a lower etch stop layer 130, an upper interlayer insulating layer 140, side spacers 160s, an upper conductive pattern 170p, an upper etch stop layer 180, and an air gap 190a.

The lower conductive pattern 120p includes a first recess region 121r. The first recess region 121r is disposed in a top surface of the lower conductive pattern 120p. An upper penetrating hole 140h of the upper interlayer insulating layer 140 partially exposes a bottom surface of the first recess region 121r.

A horizontal width w of each side spacer 160s is less than a distance between a trench 140t and the side spacer 160s. The horizontal width w of each side spacer 160s is less than a horizontal distance between the side spacer 160s and a sidewall of the upper penetrating hole 140h. The horizontal width w of each side spacer 160s is less than a horizontal distance between the side spacer 160s and a sidewall of the lower penetrating hole 130h of the lower etch stop layer 130. The horizontal width w of each of the side spacers 160s is less than a vertical distance between a bottom surface of each side spacer 160s and the bottom surface of the first recess region 121r.

A level of a bottom surface of the upper conductive pattern 170p is substantially the same as a level of the bottom surface of the first recess region 121r. A level of the bottom surface of the upper conductive pattern 170p is substantially the same as a level of a bottom surface of the trench 140t. A level of the bottom surface of the upper conductive pattern 170p is substantially the same as a level of a lowest level of the air gap 190a.

Figure 3:
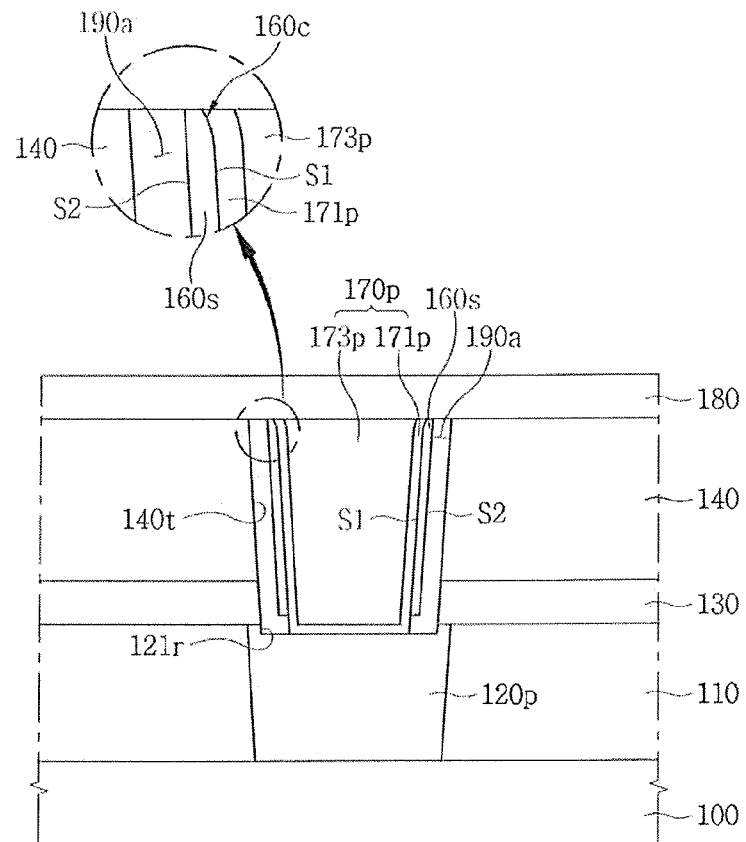
FIG. 3 is a cross-sectional view of a semiconductor device according to an exemplary embodiment of the inventive concept.

FIG. 3 is a cross-sectional view of a semiconductor device according to an exemplary embodiment of the inventive concept.

Referring to FIG. 3, a semiconductor device according to an exemplary embodiment of the inventive concept includes a semiconductor substrate 100, a lower interlayer insulating layer 110, a lower conductive pattern 120p, a lower etch stop layer 130, an upper interlayer insulating layer 140, side spacers 160s, an upper conductive pattern 170p, an upper etch stop layer 180, and an air gap 190a.

The lower conductive pattern 120p includes a first recess region 121r. A bottom surface of the upper conductive pattern 170p is substantially at the same level as a bottom surface of the first recess region 121r. A horizontal width w of each side spacer 160s is less than a distance between a trench 140t and the side spacer 160s.

A horizontal width of a top surface of each side spacer 160s is less than a horizontal width of a bottom surface thereof. A first side surface S1 of each side spacer 160s includes a curved region 160c that is bent toward a second side surface S2 of each side spacer 160s. The curved region 160c is disposed close to the upper etch stop layer 180.

Figure 4A:
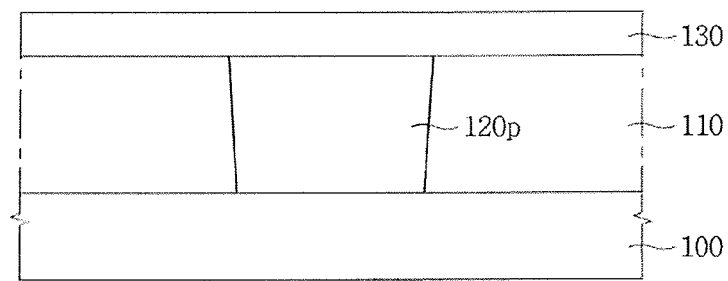
FIGS. 4A through 4R are cross-sectional views illustrating sequential operations of a method of fabricating a semiconductor device according to an exemplary embodiment of the inventive concept.
Figure 4B:
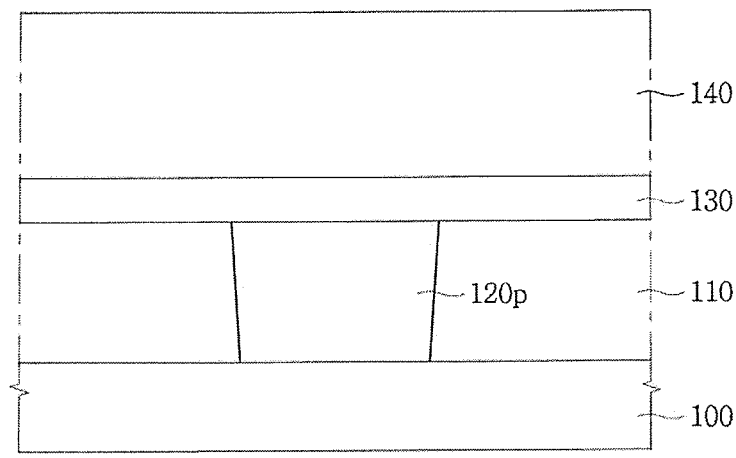
Figure 4C:
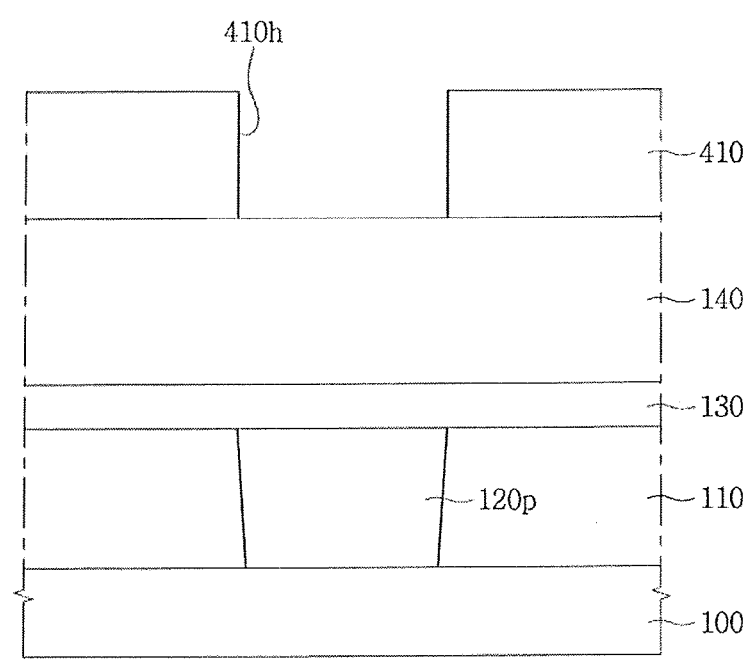
Figure 4D:
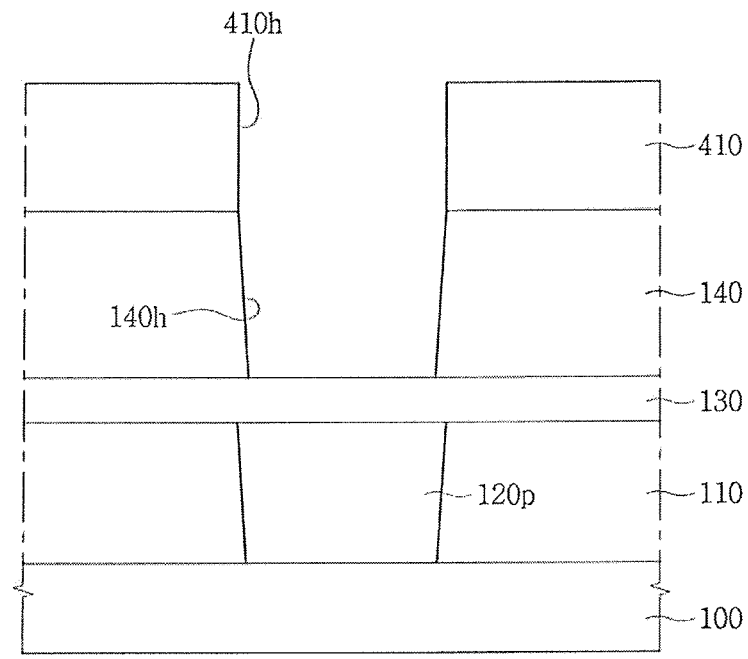
Figure 4E:
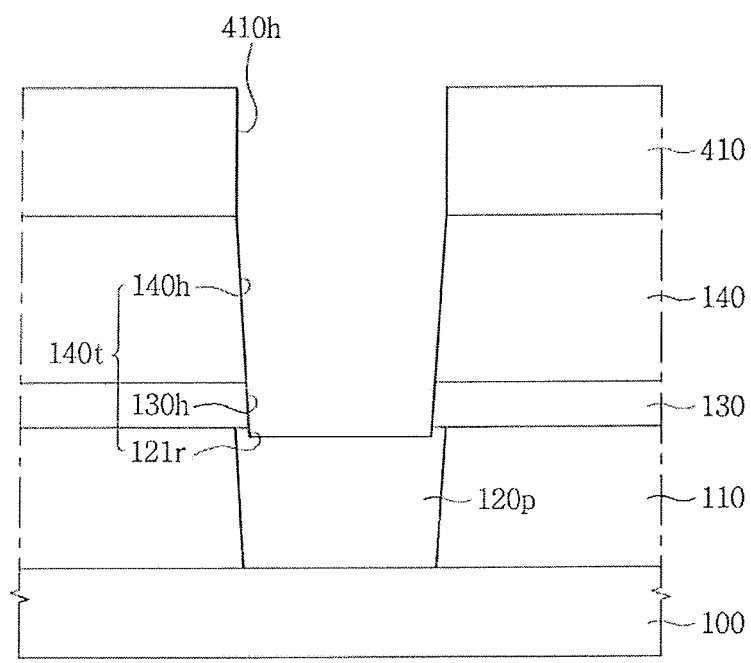
Figure 4F:
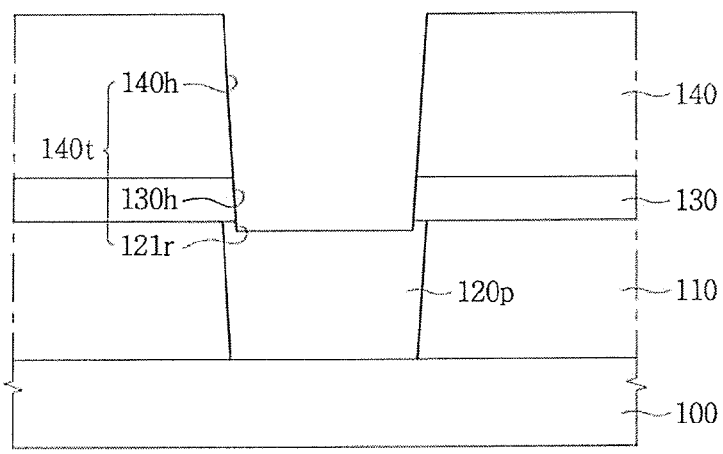
Figure 4G:
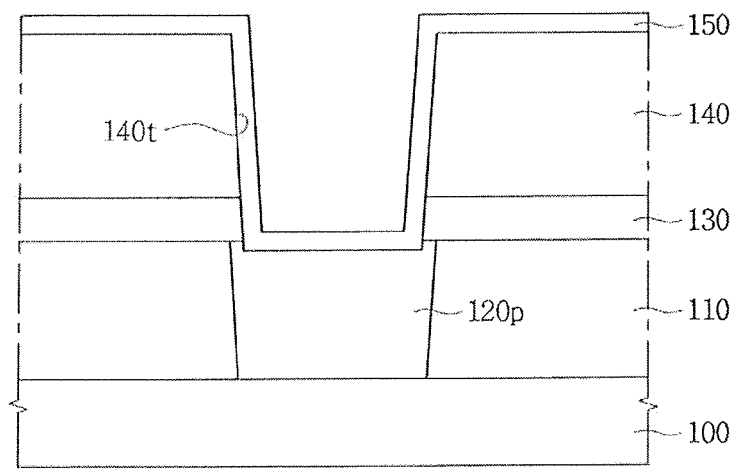
Figure 4H:
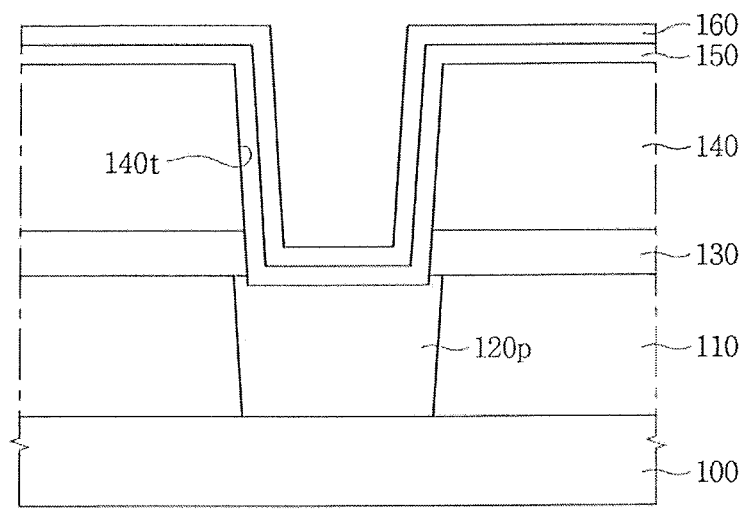
Figure 4I:
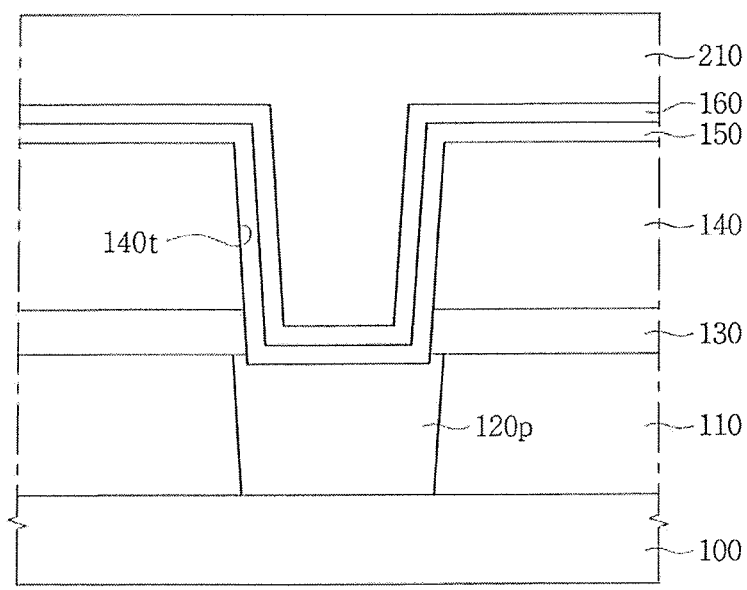
Figure 4J:
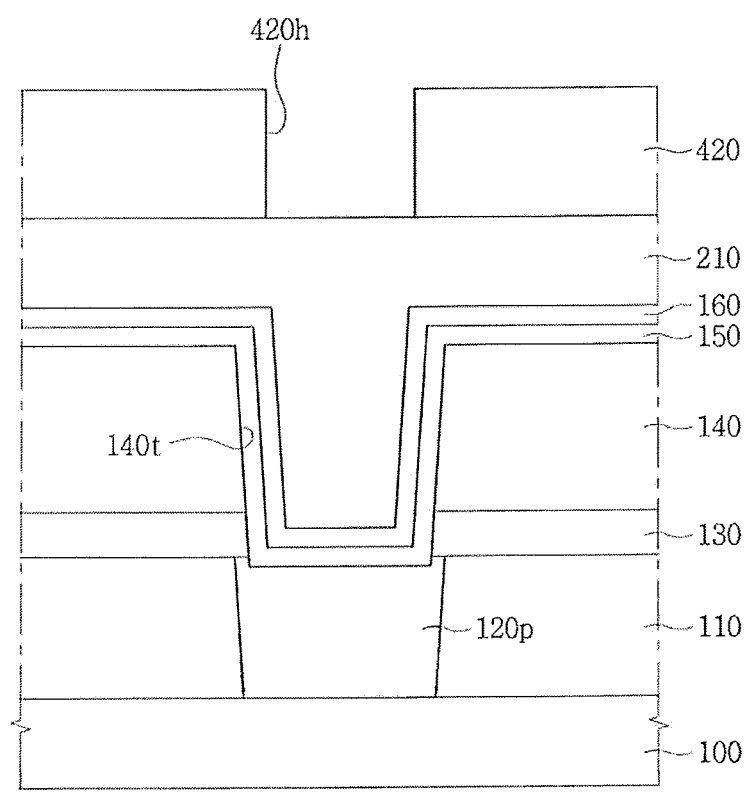
Figure 4K:
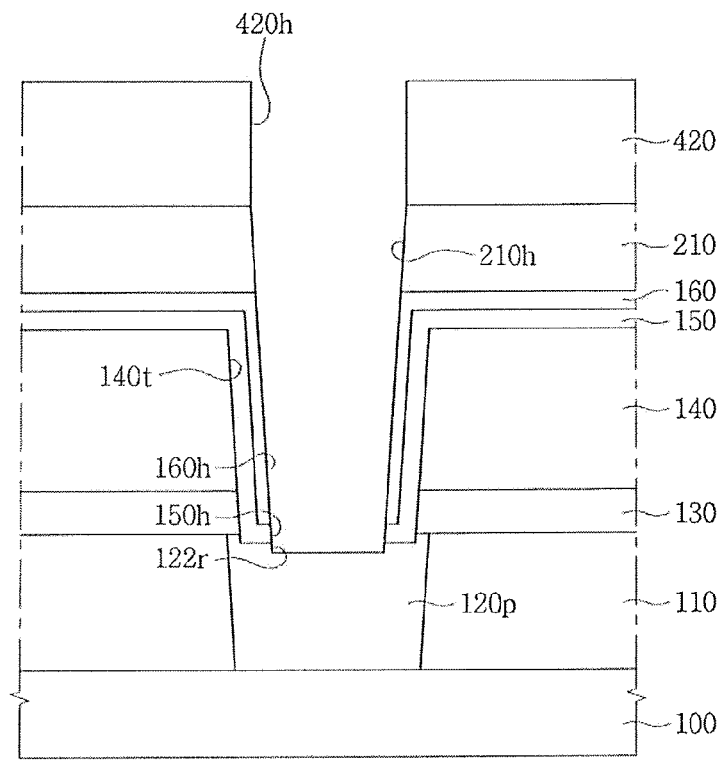
Figure 4L:
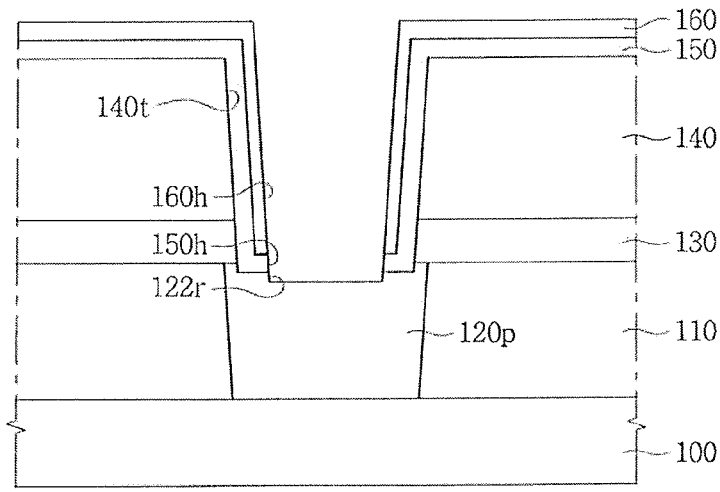
Figure 4M:
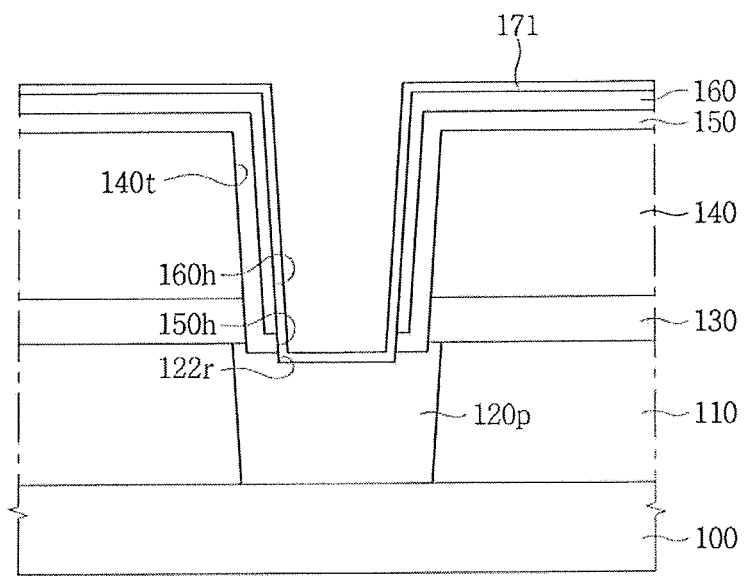
Figure 4N:
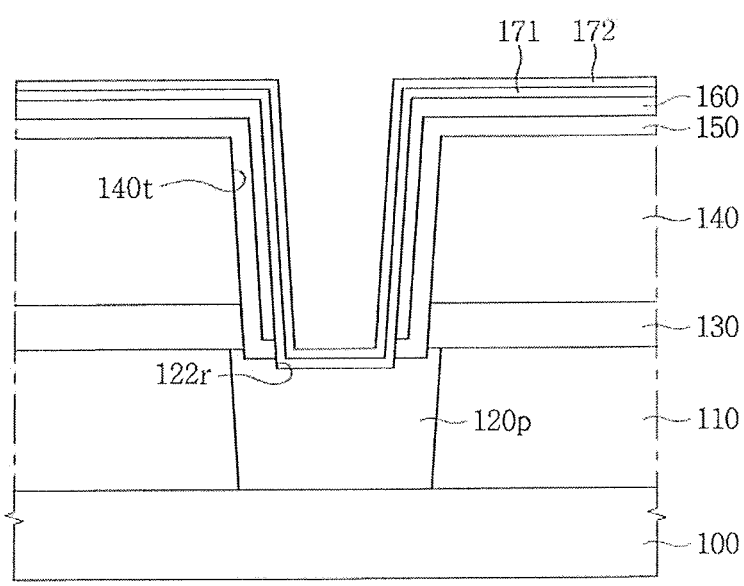
Figure 4O:
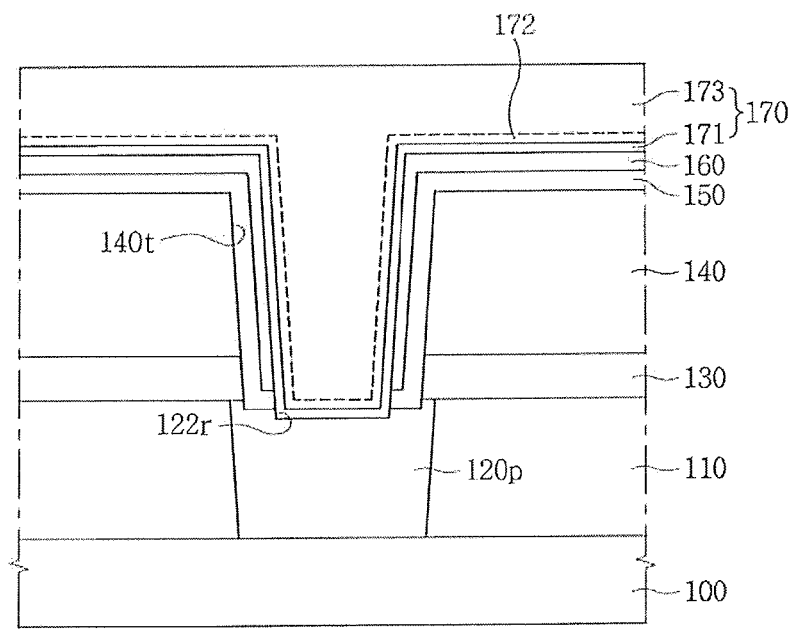
Figure 4P:
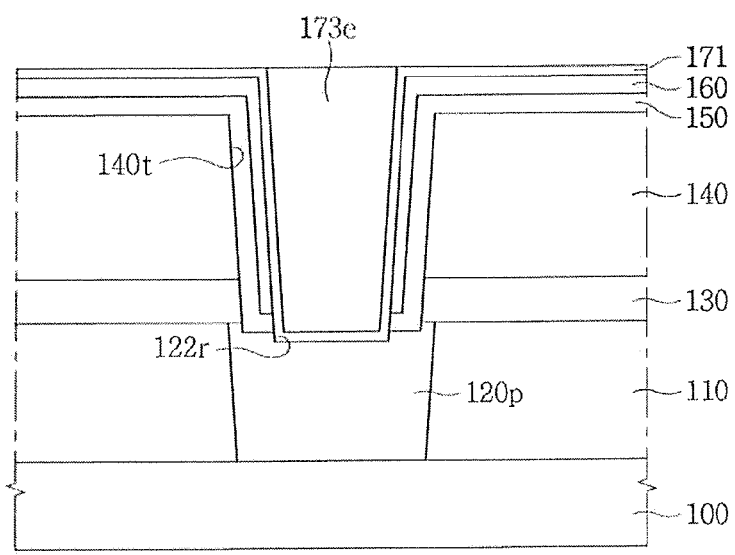
Figure 4Q:
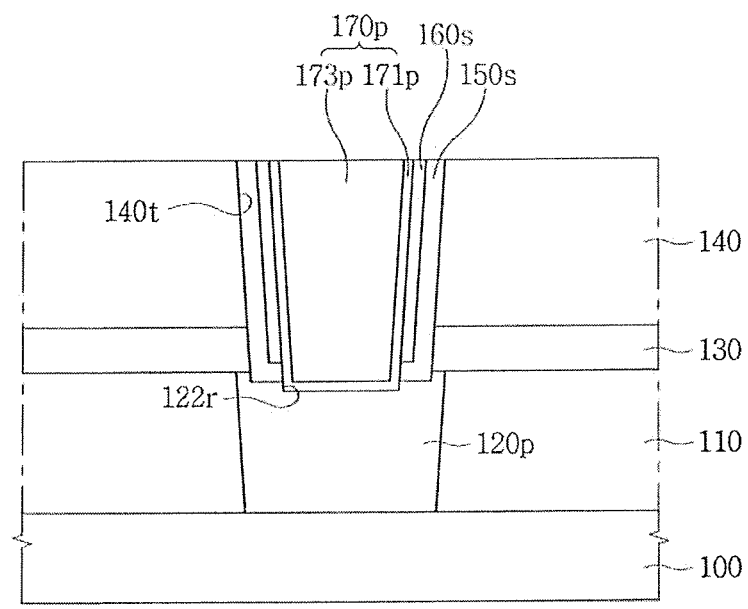
Figure 4R:
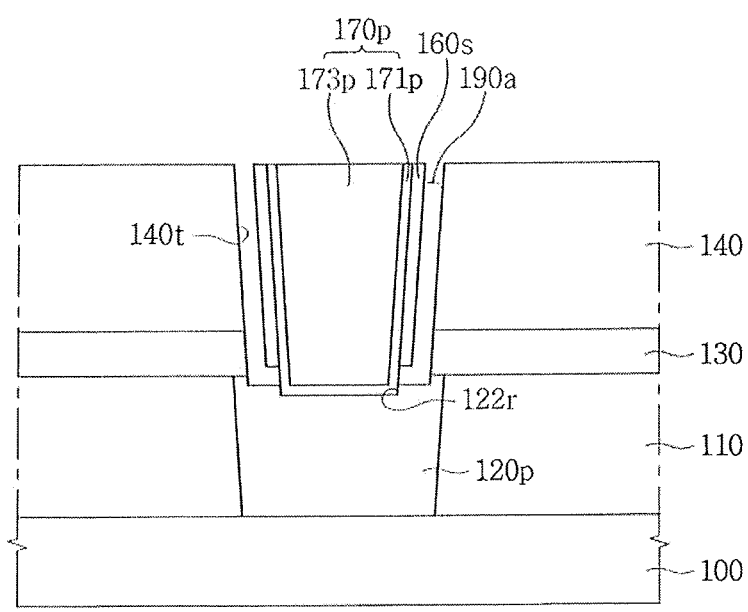

FIGS. 4A through 4R are cross-sectional views illustrating a method of fabricating a semiconductor device according to an exemplary embodiment of the inventive concept.

A method of fabricating the semiconductor device according to an exemplary embodiment of the inventive concept will now be described with reference to FIGS. 1 and 4A through 4R. Referring to FIG. 4A, the method of fabricating the semiconductor device according to an exemplary embodiment of the inventive concept includes forming a lower interlayer insulating layer 110, a lower conductive pattern 120p, and a lower etch stop layer 130 on a semiconductor substrate 100.

The formation of the lower interlayer insulating layer 110, the lower conductive pattern 120p, and the lower etch stop layer 130 on the semiconductor substrate 100 includes preparing the semiconductor substrate 100, forming the lower interlayer insulating layer 110 on the semiconductor substrate 100, forming the lower conductive pattern 120p on the semiconductor substrate 100, and forming the lower etch stop layer 130 on the lower interlayer insulating layer 110 and the lower conductive pattern 120p.

Referring to FIG. 4B, an upper interlayer insulating layer 140 is formed on the lower etch stop layer 130.

The upper interlayer insulating layer 140 may include a material having a different etch rate from the lower etch stop layer 130. For example, the upper interlayer insulating layer 140 may include a dielectric layer having a low dielectric constant.

Referring to FIG. 4C, a first mask pattern 410 is formed on the upper interlayer insulating layer 140.

A preliminary first mask pattern layer is formed on the upper interlayer insulating layer 140, and then the preliminary first mask pattern layer is patterned to form the first mask pattern 410 having a first mask hole 410h. The first mask hole 410h exposes part of the upper interlayer insulating layer 140. The first mask hole 410h is disposed on a top surface of the lower conductive pattern 120p. The first mask pattern 410 may include a photoresist pattern.

Referring to FIG. 4D, an upper penetrating hole 140h is formed in the upper interlayer insulating layer 140 using the first mask pattern 410.

The upper penetrating hole 140h partially exposes a top surface of the lower etch stop layer 130. The formation of the upper penetrating hole 140h includes etching the upper interlayer insulating layer 140 using the first mask pattern 410.

Referring to FIG. 4E, a trench 140t is formed on the semiconductor substrate 100.

The formation of the trench 140t includes forming a lower penetrating hole 130h in the lower etch stop layer 130, and forming a first recess region 121r in the top surface of the lower conductive pattern 120p. The trench 140t includes the first recess region 121r, the lower penetrating hole 130h, and the upper penetrating hole 140h. The trench 140t includes the first recess region 121r, the lower penetrating hole 130h, and the upper penetrating hole 140h.

The formation of the lower penetrating hole 130h in the lower etch stop layer 130 includes etching the lower etch stop layer 130 using the first mask pattern 410.

The formation of the first recess region 121r in the top surface of the lower conductive pattern 120p includes recessing the top surface of the lower conductive pattern 120p exposed by the lower penetrating hole 130h. The recessing of the top surface of the lower conductive pattern 120p exposed by the lower penetrating hole 130h may be performed simultaneously with a process of etching the lower etch stop layer 130 using the first mask pattern 410.

Referring to FIG. 4F, the first mask pattern 410 is removed.

Referring to FIG. 4G, a sacrificial liner insulating layer 150 is formed on the upper interlayer insulating layer 140.

The formation of the sacrificial liner insulating layer 150 includes covering a sidewall and bottom surface of the trench 140t with the sacrificial liner insulating layer 150. The formation of the sacrificial liner insulating layer 150 includes forming an insulating layer on the sidewall and bottom surface of the trench 140t to a predetermined thickness. The formation of the sacrificial liner insulating layer 150 may be performed using an atomic layer deposition (ALD) process or a plasma-enhanced ALD (PEALD) process.

The sacrificial liner insulating layer 150 may include a material having a different etch rate from the upper interlayer insulating layer 140. The sacrificial liner insulating layer 150 may have etch selectivity with respect to the upper interlayer insulating layer 140. For example, the formation of the sacrificial liner insulating layer 150 may include forming a silicon oxide (SiO) layer using a first silicon precursor. The first silicon precursor may contain a silane-based material.

Referring to FIG. 4H, a spacer insulating layer 160 is formed on the sacrificial liner insulating layer 150.

The insulating layer is formed on a top surface of the sacrificial liner insulating layer 150 in a predetermined thickness. The formation of the spacer insulating layer 160 may be performed using an ALD process or a PEALD process.

The spacer insulating layer 160 may include a material having a different etch rate from the sacrificial liner insulating layer 150. The spacer insulating layer 160 may have etch selectivity with respect to the sacrificial liner insulating layer 150. For example, the formation of the spacer insulating layer 160 may include forming a SiCN layer on the sacrificial liner insulating layer 150 using a second silicon precursor. The second silicon precursor may be a silane-based material. The second silicon precursor may be substantially the same material as the first silicon precursor.

The process of forming the spacer insulating layer 160 may be performed in-situ together with the process of forming the sacrificial liner insulating layer 150. For example, the semiconductor substrate 100 having the trench 140t may be loaded into a process chamber. The first silicon precursor may be supplied into the process chamber, and the sacrificial liner insulating layer 150 may be formed by reacting the first silicon precursor with oxygen plasma in the process chamber. The first silicon precursor may be purged from the process chamber, and then the top surface of the sacrificial liner insulating layer 150 with nitrogen plasma. The second silicon precursor may be supplied into the process chamber, and the spacer insulating layer 160 may be formed by reacting the second silicon precursor with nitrogen plasma. The second silicon precursor may be purged from the process chamber.

The spacer insulating layer 160 and the sacrificial liner insulating layer 150 may be formed using an in-situ process. Thus, thickness variation of the sacrificial liner insulating layer 150 may be reduced due to exposure to the atmosphere.

The nitrogen plasma may be generated using higher power than the oxygen plasma. For example, the oxygen plasma is generated using about 100 W power, and nitrogen plasma is generated using about 200 W power.

Referring to FIG. 4I, a planarization layer 210 is formed on the spacer insulating layer 160.

The formation of the planarization layer 210 includes filling the trench 140t with the planarization layer 210. The planarization layer 210 may include a material having high fluidity. For example, the planarization layer 210 may include forming the planarization layer 210 using SOH.

Referring to FIG. 4J, a second mask pattern 420 is formed on the planarization layer 210.

The formation of the second mask pattern 420 may include forming a preliminary second mask pattern layer, and then patterning the preliminary second mask pattern layer to form the second mask pattern 420 having a second mask hole 420h. The second mask hole 420h exposes part of the planarization layer 210, and is disposed on a top surface of the lower conductive pattern 120. A horizontal width of the second mask hole 420h is less than a horizontal width of the bottom surface of the trench 140t. For example, the horizontal width of the second mask hole 420h may be substantially equal to a maximum horizontal distance between sidewalls of the spacer insulating layer 160 disposed on sidewalls of the trench 140t. The second mask pattern 420 may be substantially similar to the first mask pattern 410. For example, the second mask pattern 420 may include a photoresist pattern.

Referring to FIG. 4K, a second recess region 122r is formed in the top surface of the lower conductive pattern 120p formed on the semiconductor substrate 100.

The formation of the second recess region 122r may include forming a planarization penetrating hole 210h in the planarization layer 210, forming a spacer penetrating hole 160h in the spacer insulating layer 160, forming a liner penetrating hole 150h in the sacrificial liner insulating layer 150, and recessing the top surface of the lower conductive pattern 120p.

The formation of the planarization penetrating hole 210h in the planarization layer 210 may include etching the planarization layer 210 using the second mask pattern 420.

The formation of the spacer penetrating hole 160h in the spacer insulating layer 160 may include etching the spacer insulating layer 160 using the second mask pattern 420. The etching of the spacer insulating layer 160 using the second mask pattern 420 may be performed simultaneously with the etching of the planarization layer 210 using the second mask pattern 420.

The formation of the liner penetrating hole 150h in the sacrificial liner insulating layer 150 may include etching the sacrificial liner insulating layer 150 using the second mask pattern 420. The etching of the sacrificial liner insulating layer 150 using the second mask pattern 420 may be performed simultaneously with the etching of the spacer insulating layer 160 using the second mask pattern 420.

The recessing of the top surface of the lower conductive pattern 120p may include recessing the top surface of the lower conductive pattern 120p exposed by the liner penetrating hole 150h. The recessing of the top surface of the lower conductive pattern 120p exposed by the liner penetrating hole 150h may be performed simultaneously with the etching of the sacrificial liner insulating layer 150 using the second mask pattern 420.

Referring to FIG. 4L, the second mask pattern 420 and the planarization layer 210 are removed.

Referring to FIG. 4M, the method of fabricating the semiconductor device according to an exemplary embodiment of the inventive concept may include forming a barrier layer 171 on the spacer insulating layer 160.

The formation of the barrier layer 171 includes covering a sidewall of the spacer penetrating hole 160h, a sidewall of the liner penetrating hole 150h, and a sidewall and bottom surface of the second recess region 122r with the barrier layer 171.

Referring to FIG. 4N, a seed layer 172 is formed on the barrier layer 171.

The formation of the seed layer 172 may include forming the seed layer 172 using substantially the same material as a metal layer 173 to be formed using a subsequent process.

Referring to FIG. 4O, an upper conductive layer 170 is formed on the seed layer 172, filling a region surrounded by the trench 140t.

The formation of the upper conductive layer 170 includes forming the metal layer 173 on the seed layer 172.

The formation of the metal layer 173 includes filling the spacer penetrating hole 160h, the liner penetrating hole 150h, and the second recess region 122r with the metal layer 173. The formation of the metal layer 173 includes filling a space between sidewalls of the spacer insulating layer 160 disposed on the sidewalls of the trench 140t with the metal layer 173. The formation of the metal layer 173 may be performed using an electroplating process.

Referring to FIG. 4P, a preliminary metal pattern 173e is formed on the semiconductor substrate 100.

The formation of the preliminary metal pattern 173e includes planarizing the metal layer 173 to expose a top surface of the barrier layer 171. The planarization of the metal layer 173 may be performed using a chemical mechanical polishing (CMP) process.

Referring to FIG. 4Q, a sacrificial liner pattern 150s, a side spacer 160s, and an upper conductive pattern 170p are formed on the semiconductor substrate 100.

The formation of the sacrificial liner pattern 150s, the side spacer 160s, and the upper conductive pattern 170p includes planarizing the sacrificial liner insulating layer 150, the spacer insulating layer 160, the barrier layer 171, and the preliminary metal pattern 173e to expose a top surface of the upper interlayer insulating layer 140. The planarization of the sacrificial liner insulating layer 150, the spacer insulating layer 160, the barrier layer 171, and the preliminary metal pattern 173e may be performed using a CMP process. The upper conductive pattern 170p includes a barrier metal 171p and a metal pattern 173p.

The formation of the sacrificial liner pattern 150s, the side spacer 160s, and the upper conductive pattern 170p may be performed in the same chamber as the process of forming the preliminary metal pattern 173e.

Referring to FIG. 4R, an air gap 190a is formed in the trench 140t.

The formation of the air gap 190a in the trench 140t includes removing the sacrificial liner pattern 150s.

The sacrificial liner pattern 150s may include a material having a different etch rate from the upper interlayer insulating layer 140 and the side spacer 160s. Thus, the sacrificial liner pattern 150s is selectively removed to form the air gap 190a.

Forming of the sacrificial liner insulating layer 150 and the spacer insulating layer 160 using an in-situ process, and forming the sacrificial liner pattern 150s and the side spacer 160s may reduce the number of processes required to form the sacrificial liner pattern 150s and the side spacer 160s, thereby increasing process efficiency.

Referring to FIG. 1, an upper etch stop layer 180 on the trench 140t is formed to cover the air gap 190a.

FIGS. 5A through 5G are cross-sectional views illustrating sequential operations of a method of fabricating a semiconductor device according to an exemplary embodiment of the inventive concept.

The method of fabricating the semiconductor device according to an exemplary embodiment of the inventive concept will now be described with reference to FIGS. 2 and 5A through 5G. To begin with, referring to FIG. 5A, the method of fabricating the semiconductor device according to an exemplary embodiment of the inventive concept includes preparing a semiconductor substrate 100, forming a lower interlayer insulating layer 110 on the semiconductor substrate 100, forming a lower conductive pattern 120p on the semiconductor substrate 100, forming a lower etch stop layer 130 on the lower interlayer insulating layer 110 and the lower conductive pattern 120p, forming an upper interlayer insulating layer 140 on the lower etch stop layer 130, forming a trench 140t through the upper interlayer insulating layer 140, forming a sacrificial liner insulating layer 150 to cover a sidewall and bottom surface of the trench 140t, and forming a spacer insulating layer 160 on the sacrificial liner insulating layer 150.

Figure 5A:
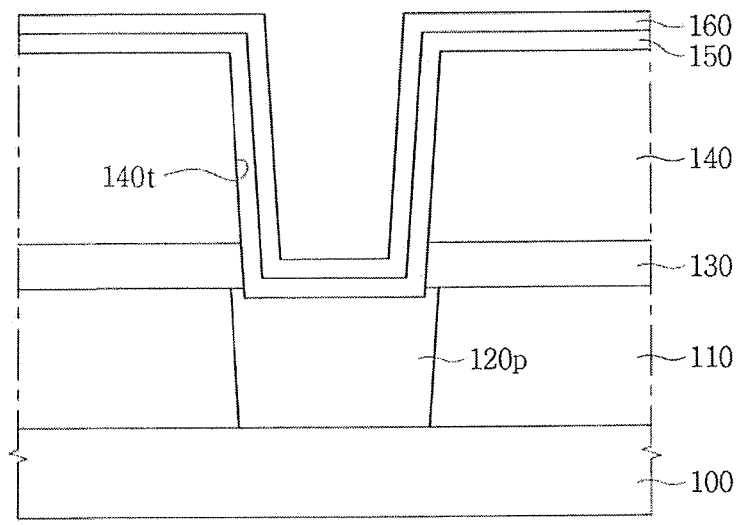
FIGS. 5A through 5G are cross-sectional views illustrating sequential operations of a method of fabricating a semiconductor device according to an exemplary embodiment of the inventive concept.
Figure 5B:
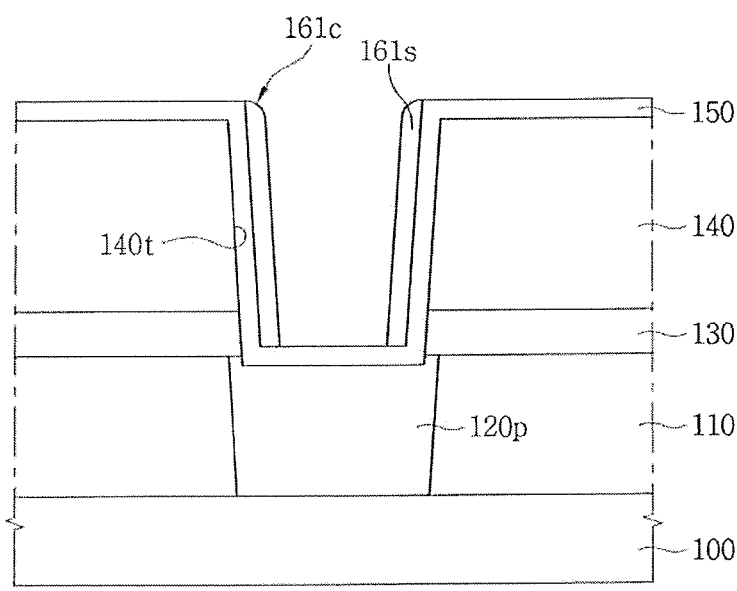

Referring to FIG. 5B, a first preliminary side spacer 161s is formed on the sacrificial liner insulating layer 150.

The formation of the first preliminary side spacer 161s includes etching the spacer insulating layer 160. For example, the formation of the first preliminary side spacer 161s may include anisotropically etching the spacer insulating layer 160.

The first preliminary side spacer 161s includes a first preliminary curved region 161c. The first preliminary curved region 161c may be disposed close to a top surface of the first preliminary side spacer 161s.

Figure 5C:
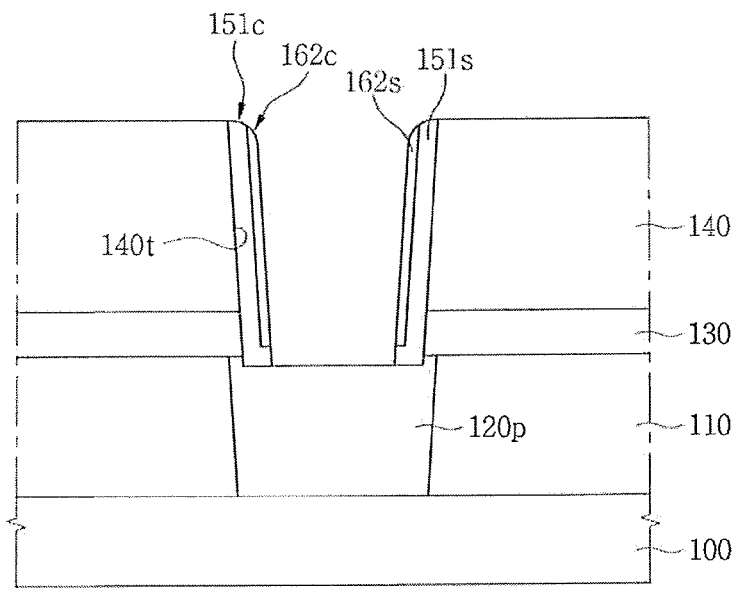

Referring to FIG. 5C, a sacrificial spacer 151s and a second preliminary side spacer 162s are formed within the trench 140t.

The formation of the sacrificial spacer 151s and the second preliminary side spacer 162s may include etching the sacrificial liner insulating layer 150 and the first preliminary side spacer 161s. For example, the formation of the sacrificial spacer 151s and the second preliminary side spacer 162s may include anisotropically etching the sacrificial liner insulating layer 150 and the first preliminary side spacer 161s.

The anisotropic etching of the sacrificial liner insulating layer 150 and the first preliminary side spacer 161s may be performed simultaneously with the process of anisotropically etching the spacer insulating layer 160. FIG. 5B may be a cross-sectional view of a shape formed in the middle of the corresponding process.

The sacrificial spacer 151s includes a sacrificial curved region 151c. The sacrificial curved region 151c is disposed close to a top surface of the sacrificial spacer 151s.

The second preliminary side spacer 162s includes a second preliminary curved region 162c. The second preliminary curved region 162c is disposed close to a top surface of the second preliminary side spacer 162s. A surface of the second preliminary curved region 162c may correspond to an extension line of a surface of the sacrificial curved region 151c. Alternatively, the surface of the second preliminary curved region 162c may have substantially the same curvature as the surface of the sacrificial curved region 151c.

Figure 5D:
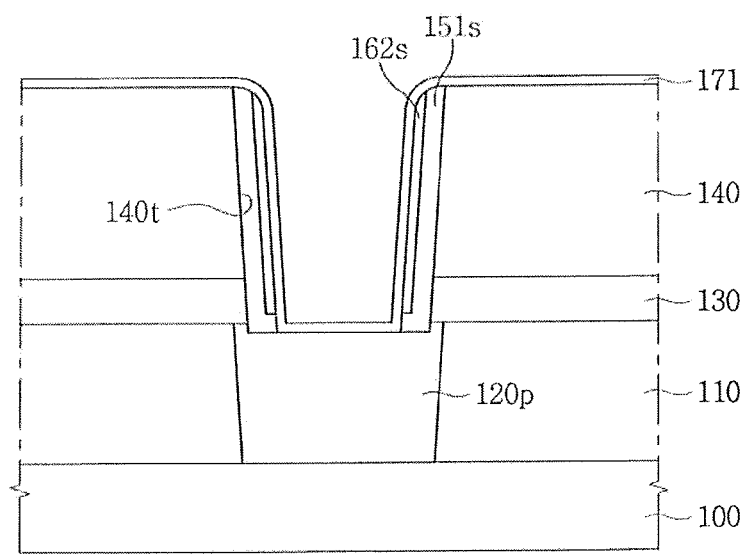

Referring to FIG. 5D, a barrier layer 171 is formed on the upper interlayer insulating layer 140.

The formation of the barrier layer 171 includes forming the barrier layer 171 to cover the sacrificial spacer 151s and the second preliminary side spacer 162s.

Figure 5E:
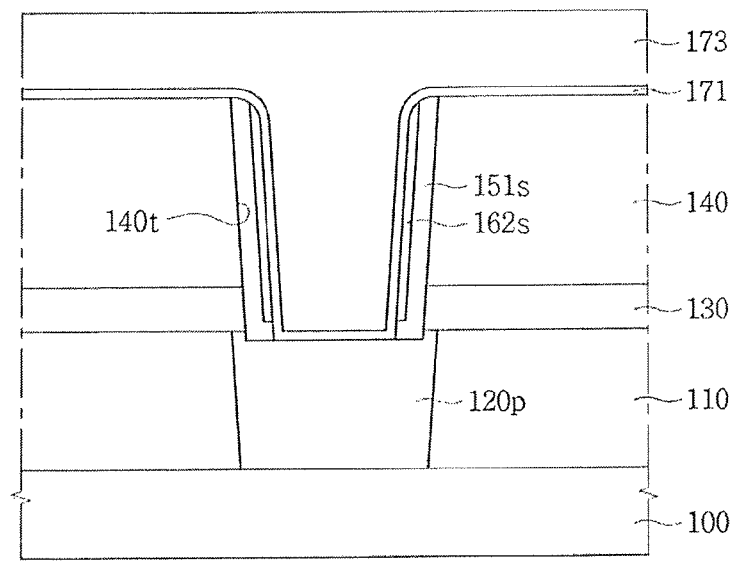

Referring to FIG. 5E, the method of fabricating the semiconductor device according to an exemplary embodiment of the inventive concept may include forming an upper conductive layer 170 to fill the trench 140t.

The formation of the upper conductive layer 170 includes forming a metal layer 173 on the barrier layer 171.

Figure 5F:
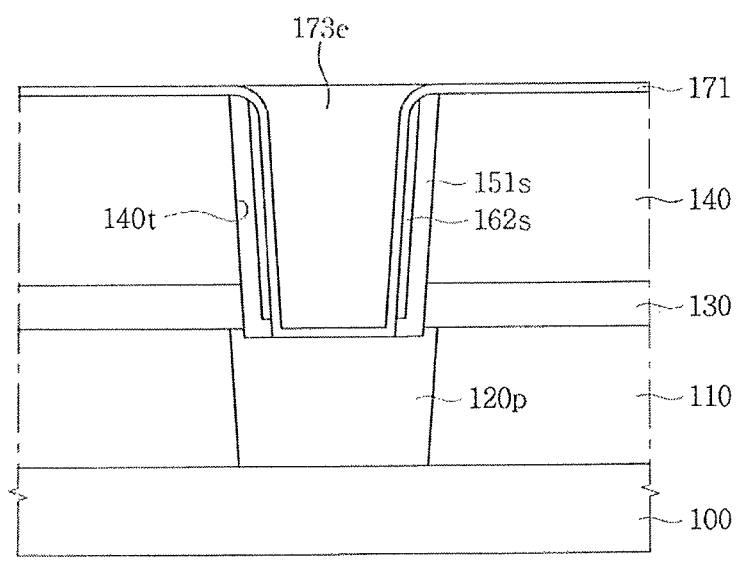

Referring to FIG. 5F, a preliminary metal pattern 173e is formed to fill the trench 140t.

The formation of the preliminary metal pattern 173e includes planarizing the metal layer 173 to expose a top surface of the barrier layer 171.

Figure 5G:
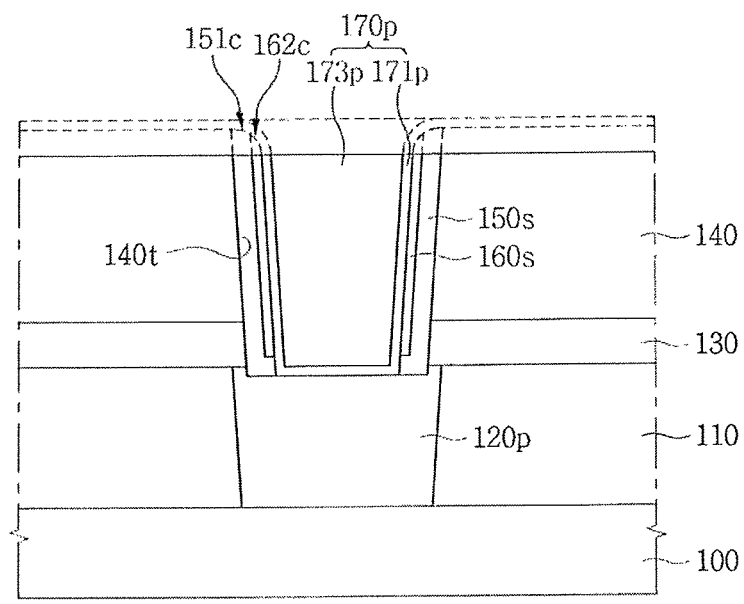

Referring to FIG. 5G, a sacrificial liner pattern 150s, a side spacer 160s, a barrier pattern 171p, and a metal pattern 173p are formed to fill the trench 140t.

The formation of the sacrificial liner pattern 150s, the side spacer 160s, the barrier pattern 171p, and the metal pattern 173p includes planarizing the upper interlayer insulating layer 140, the sacrificial spacer 151s, the second preliminary side spacer 162s, the barrier layer 171, and the preliminary metal pattern 173e to remove the sacrificial curved region 151c and the second preliminary curved region 162c. The planarization of the upper interlayer insulating layer 140, the sacrificial spacer 151s, the second preliminary side spacer 162s, the barrier layer 171, and the preliminary metal pattern 173e is performed using a CMP process.

An upper conductive pattern 170p includes the barrier pattern 171p and the metal pattern 173p.

Referring to FIG. 2, an air gap 190a is formed in the trench 140t by removing the sacrificial liner pattern 150s, and an upper etch stop layer 180 is formed on the trench 140t.

The formation of the air gap 190a in the trench 140t includes removing the sacrificial liner pattern 150s.

Figure 6:
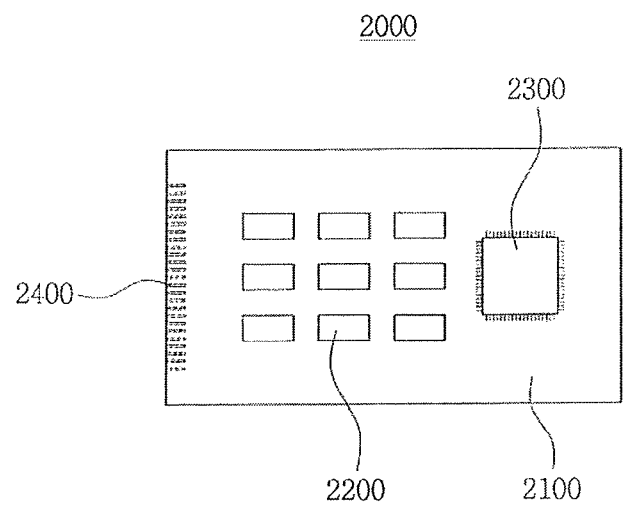
FIG. 6 is a diagram of a semiconductor module including a semiconductor device according to an exemplary embodiment of the inventive concept.

FIG. 6 is a diagram of a semiconductor module 1000 including a semiconductor device according to an exemplary embodiment of the inventive concept.

Referring to FIG. 6, the semiconductor module 1000 includes a module substrate 1100, memories 1200, a microprocessor (MP) 1300, and input/output (I/O) terminals 1400. The memories 1200, the MP 1300, and the I/O terminals 1400 are mounted on the module substrate 1100. The semiconductor module 1000 may include a memory card or a card package.

Each of the memories 1200 and the MP 1300 may include a semiconductor device according to an exemplary embodiment of the inventive concept. Accordingly, operation speeds of the memories 1200 and the MP 1300 may be increased.

Figure 7:
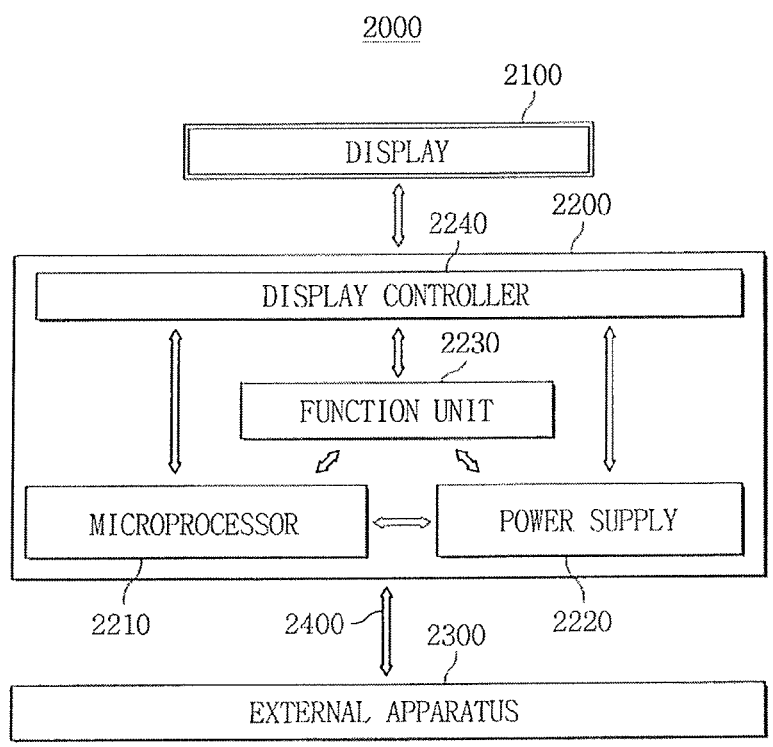
FIG. 7 is a diagram of a mobile system including a semiconductor device according to an exemplary embodiment of the inventive concept.

FIG. 7 is a diagram of a mobile system 2000 including a semiconductor device according to an exemplary embodiment of the inventive concept.

Referring to FIG. 7, the mobile system 2000 includes a display unit 2100, a body unit 2200, and an external apparatus 2300. The body unit 2200 includes an MP 2210, a power supply 2220, a function unit 2230, and a display controller 2240.

The display unit 2100 is electrically connected to the body unit 2200. The display unit 2100 is electrically connected to the display controller 2240 of the body unit 2200. The display unit 2100 displays an image processed by the display controller 2240 of the body unit 2200.

The body unit 2200 includes a system board or motherboard including a printed circuit board (PCB). The MP 2210, the power supply 2220, the function unit 2230, and the display controller 2240 are mounted on the body unit 2200.

The MP 2210 receives a voltage from the power supply 2230 and controls the function unit 2230 and the display controller 2240. The power supply 2220 receives a predetermined voltage from an external power supply, divide the predetermined voltage into various voltage levels, and supply the divided voltages to the MP 2210, the function unit 2230, and the display controller 2240.

The power supply 2220 includes a power management IC (PMIC). The PMIC efficiently supplies voltages to the MP 2210, the function unit 2230, and the display controller 2240.

The function unit 2230 serves various functions of the mobile system 2000. For example, the function unit 2230 may include several elements capable of wireless communication functions, such as output of an image to the display unit 2100 or output of a voice to a speaker, by dialing or communication with the external apparatus 2300. For example, the functional unit 2230 may serve as an image processor of a camera.

When the electronic system 2230 is connected to a memory card to increase the storage capacity of the mobile system 2000, the functional unit 2230 serves as a memory card controller. In addition, when the mobile system 2000 further includes a universal serial bus (USB) to expand functions thereof, the functional unit 2230 may serve as an interface controller.

Each of the MP 2210, the power supply 2220, and the function unit 2230 includes a semiconductor device according to various exemplary embodiments of the inventive concept. Accordingly, operation speeds of the MP 2210, the power supply 2220, and the function unit 2230 may be increased.

Figure 8:
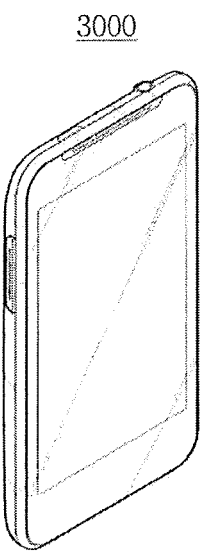
FIG. 8 is a diagram of a mobile device including a semiconductor device according to an exemplary embodiment of the inventive concept.

FIG. 8 is a diagram of a mobile device 3000 including a semiconductor device according to an exemplary embodiment of the inventive concept.

Referring to FIG. 8, the mobile device 3000 may be a mobile wireless phone. Alternatively, the mobile device 3000 may be a tablet personal computer (PC). The mobile device 3000 may include a semiconductor device according to an exemplary embodiment of the inventive concept. Thus, operation speed of the mobile device 3000 according to an exemplary embodiment of the inventive concept may be increased.

Figure 9:
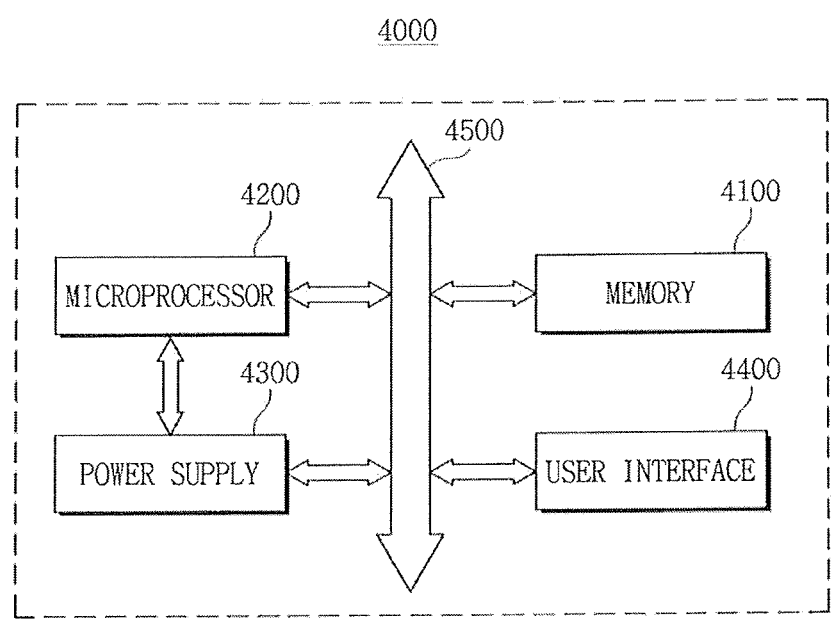
FIG. 9 is a diagram of an electronic system including a semiconductor device according to an exemplary embodiment of the inventive concept.

FIG. 9 is a construction diagram of an electronic system 4000 including a semiconductor device according to an exemplary embodiment of the inventive concept.

Referring to FIG. 9, the electronic system 4000 includes a memory 4100, an MP 4200, a power supply 4300, and a user interface 4400. The electronic system 3000 may include a light-emitting diode (LED) illumination system, a refrigerator, an air conditioner, an industrial cutter, a welding machine, an automobile, a vessel, an airplane, or an artificial satellite.

The memory 4100 may store codes for booting the MP 4200, data processed by the MP 4200, or external input data. The memory 4100 may include a controller and a memory.

The MP 4200 may program and control the electronic system 4000. The MP 4200 may include a random access memory (RAM) used as an operation memory.

The power supply 4300 may receive a predetermined voltage from an external power supply and supply appropriate voltages to the memory 4100, the MP 4200, and the user interface 400 using the received voltage. The power supply 4300 may include a PMIC.

The user interface 4400 may communicate data using a bus 4500. The user interface 4400 may be used to input/output data to/from the electronic system 4000.

Each of the memory 4100 and the MP 4200 may include a semiconductor device according to an exemplary embodiment of the inventive concept. Accordingly, operation speeds of the memory 4100 and the MP 4200 may be increased.

According to an exemplary embodiment of the inventive concept, a semiconductor device may include a conductive pattern disposed within a trench formed through an interlayer insulating layer, side spacers disposed on side surfaces of the conductive pattern, and an air gap interposed between the trench and the side spacers. Thus, in a semiconductor device and a method of fabricating the same according to an exemplary embodiment of the inventive concept, a signal delay time of the conductive pattern may be reduced. Accordingly, in the semiconductor device and the method of fabricating the same according to an exemplary embodiment of the inventive concept, operation speed may be increased.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device comprising:
a semiconductor substrate;
an interlayer insulating layer disposed on the semiconductor substrate, the interlayer insulating layer including a trench penetrating the interlayer insulating layer;
a conductive pattern disposed within the trench, a bottom surface of the conductive pattern being in contact with a bottom surface of the trench;
an etch stop layer disposed on the conductive pattern, the etch stop layer covering the trench;
a side spacer covering a side surface of the conductive pattern, the side spacer being spaced from the interlayer insulating layer; and
an air gap bounded by the interlayer insulating layer, the conductive pattern, the etch stop layer and the side spacer,
wherein a bottom surface of the side spacer is spaced from the bottom surface of the trench, and
wherein a vertical length between the bottom surface of the side spacer and the bottom surface of the trench is substantially equal to a horizontal width of the side spacer.

2. The device of claim 1, wherein the horizontal width of the side spacer is substantially equal to a horizontal length between a side surface of the side spacer and a sidewall of the trench.

3. The device of claim 1, wherein a vertical length of a lower side surface of an upper conductive pattern which is not covered by the side spacer is greater than the vertical length between the bottom surface of the side spacer and the bottom surface of the trench.

4. A semiconductor device comprising:
a semiconductor substrate;
an interlayer insulating layer disposed on the semiconductor substrate, the interlayer insulating layer including a trench penetrating the interlayer insulating layer;
a conductive pattern disposed within the trench;
an etch stop layer disposed on the conductive pattern;
a side spacer covering a side surface of the conductive pattern, the side spacer being spaced from the interlayer insulating layer; and
an air gap bounded by the interlayer insulating layer, the conductive pattern, the etch stop layer and the side spacer,
wherein a bottom surface of the side spacer is spaced from a bottom surface of the trench, and
wherein a vertical length between the bottom surface of the side spacer and the bottom surface of the trench is substantially equal to a horizontal width of the side spacer.

5. The device of claim 4, wherein the horizontal width of the side spacer is substantially equal to a horizontal length between a side surface of the side spacer and a sidewall of the trench.

6. The device of claim 4, wherein a vertical length of a lower side surface of an upper conductive pattern which is not covered by the side spacer is greater than the vertical length between the bottom surface of the side spacer and the bottom surface of the trench.

7. The device of claim 4, wherein a bottom surface of the conductive pattern is in contact with the bottom surface of the trench.

8. The device of claim 4, wherein the etch stop layer covers the trench.

* * * * *